United States Patent
Meyer et al.

(10) Patent No.: US 7,884,288 B2
(45) Date of Patent: Feb. 8, 2011

(54) SCREENED HOUSING WITH PRESS-FIT PINS AND METHOD FOR PRODUCTION THEREOF

(75) Inventors: Frank Meyer, Obertraubling (DE); Wolfgang Puscher, Neutraubling (DE)

(73) Assignee: Continental Automotive GmbH, Hannover (DE)

( * ) Notice: Subject to any disclaimer, the term of this patent is extended or adjusted under 35 U.S.C. 154(b) by 414 days.

(21) Appl. No.: 12/065,320

(22) PCT Filed: Jul. 25, 2006

(86) PCT No.: PCT/EP2006/064618

§ 371 (c)(1), (2), (4) Date: Feb. 29, 2008

(87) PCT Pub. No.: WO2007/028668

PCT Pub. Date: Mar. 15, 2007

(65) Prior Publication Data
US 2008/0245562 A1    Oct. 9, 2008

(30) Foreign Application Priority Data
Sep. 5, 2005    (DE) .................. 10 2005 042 131

(51) Int. Cl.
*H01R 4/00* (2006.01)

(52) U.S. Cl. .................. 174/372; 174/50; 174/368; 439/567; 361/773

(58) Field of Classification Search ............ 174/50, 174/372, 386, 250, 368; 439/567, 342, 701; 361/773
See application file for complete search history.

(56) References Cited

U.S. PATENT DOCUMENTS

| 3,179,915 | A | * | 4/1965 | Klassen | 439/564 |
|---|---|---|---|---|---|
| 3,351,817 | A | * | 11/1967 | Wadolny et al. | 361/728 |
| 4,029,896 | A | * | 6/1977 | Skinner | 174/138 F |
| 4,653,092 | A | * | 3/1987 | Neail et al. | 379/327 |
| 5,051,870 | A | * | 9/1991 | Companion | 361/773 |
| 5,557,504 | A | * | 9/1996 | Siegel et al. | 361/773 |
| 5,967,846 | A | * | 10/1999 | Davis et al. | 439/607.19 |
| 6,217,378 | B1 | | 4/2001 | Wu | 439/567 |
| 6,672,901 | B2 | | 1/2004 | Schulz et al. | 439/607 |
| 2002/0025720 | A1 | | 2/2002 | Bright et al. | 439/607 |

FOREIGN PATENT DOCUMENTS

DE    298 08 620 U1    9/1998
DE    101 02 459 A1    7/2002

* cited by examiner

*Primary Examiner*—Dhiru R Patel
(74) *Attorney, Agent, or Firm*—King & Spalding L.L.P.

(57) ABSTRACT

A screened housing (1) with press-fit pins (2) for electrical contacting on an electrical support component, in particular for automobile application, is composed of two housing sections (14,15) each including a housing base (3) each with two housing edges (4) with press-fit pins (2). Above all a screened housing is achieved by the invention with press-fit pins around all four circumferential sides which can be produced simply and economically in a follow-on composite tool. Such screened housings are particularly suitable for automobile applications for screening electrical components from incoming or emitting electromagnetic radiation.

13 Claims, 3 Drawing Sheets

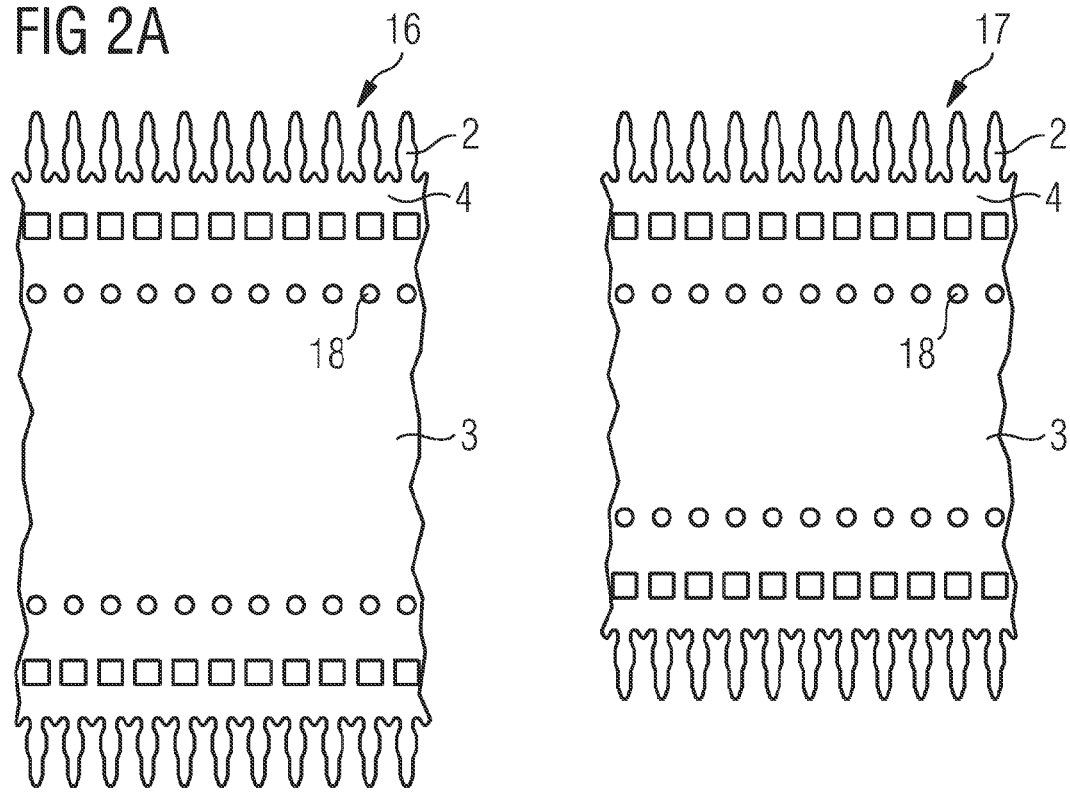
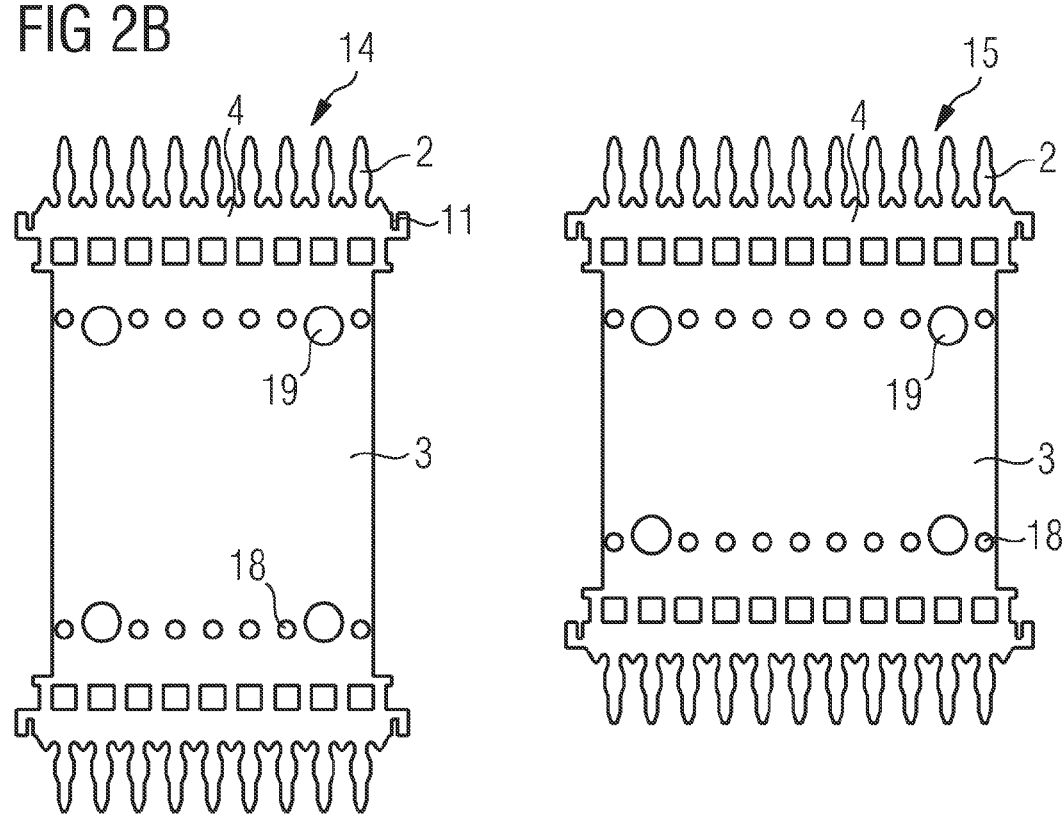

SCREENED HOUSING WITH PRESS-FIT PINS AND METHOD FOR PRODUCTION THEREOF

CROSS-REFERENCE TO RELATED APPLICATION

This application is a U.S. national stage application of International Application No. PCT/EP2006/064618 filed Jul. 25, 2006, which designates the United States of America, and claims priority to German application number 10 2005 042 131.8 filed Sep. 5, 2005, the contents of which are hereby incorporated by reference in their entirety.

TECHNICAL FIELD

The invention relates to a screened housing with press-fit pins for electrical contacting on an electrical support component, in particular for automotive applications, and a method for production thereof.

BACKGROUND

To screen electronic components from incoming or emitting electromagnetic radiation, screened housings or tuner boxes are used. These must not only be well connected electrically to the circuit board but also electrically "sealed" all-round corresponding to the radiation frequency, i.e. specific gap widths must not be exceeded.

The use of screened housings with soldering pins and/or transposition or cross-connection lugs or with surface-mounted components in SMD technology is conceivable.

A housing for an electrical component that can be connected to the housing by plugging in is known that has mounting pins for attaching said housing to a circuit board, and a method for mounting such a housing on a circuit board. The attaching pins can be connected to the circuit board by forming a press-fit connection. The method is characterized in that the plug for an electronic component is first soldered to the circuit board and tested and the housing is then placed over the plug and on to the circuit board, with the attaching pins being connected to the circuit board by forming a press-fit connection.

The term press-fit connection means connections that form a connection between the pins and the circuit board solely by inserting the attaching pins in the corresponding openings of the circuit board, without the need for further assembly steps, such as soldering or bonding. Press-fit connections can be both form-fit connections or mechanical-fit connections.

If the known press-fit technique is used to apply the screened housing to the circuit board, the corresponding number of press-fit contacts, which are coupled to the radiation frequency, must be present on all four circumferential surfaces of the housing. Shown in a developed view of the metal sheet, this means that four stamping/embossing stations must also be provided for the four circumferential surfaces in all four directions. As an alternative to this, the arrangement of press-fit pins on only two opposite circumferential sides is known, with spring elements being used, offset by 90° on the circumferential sides, that provide the contact to the circuit board by means of contact pressure.

This construction for a follow-on composite tool is, however, very cost intensive so that the end products do not bear price comparison with conventionally produced tuner boxes using soldering, welding or other connecting techniques. Therefore, the use of screened housings with press-fit pins is uneconomical despite substantial advantages during the final mounting of such press-fit housings on electronic assemblies.

SUMMARY

A cost-effective screened housing whose production process can be implemented simply in a follow-on composite tool can be provided according to an embodiment by a screened housing comprising press-fit pins for electrical contacting on an electrical support component, wherein the screened housing consists of two housing sections, each of which has a housing base each with two housing edges with press-fit pins.

According to another embodiment, a method for producing a screened housing with press-fit pins for electrical contacting on an electrical supporting component, may comprise the steps of:—stamping and embossing a continuous sheet-metal strip with press-fit pins arranged on two parallel sides;—stamping out two housing sections from the sheet-metal strip;—bending the edge areas with the press-fit pins through 90°;—rotating the housing sections through 90° relative to each other; and—joining the housing sections to each other.

According to a further embodiment, the housing sections may be attached to each other rotated 90° relative to each other. According to a further embodiment, the housing sections can be attached to each other on the housing base. According to a further embodiment, the housing base can be stamped out in various widths. According to a further embodiment, the housing sections each may have two housing edges running parallel to each other, each of which has anchoring means on the ends. According to a further embodiment, the screened housing may have pockets for the introduction of the force and to receive the press tool.

BRIEF DESCRIPTION OF THE DRAWINGS

Further advantages and embodiments of the invention are explained in the following with the aid of exemplary embodiments and drawings.

The drawings are as follows:

FIGS. 2a to 2d A plan view showing the process steps of the production method for a screened housing with press-fit pins.

DETAILED DESCRIPTION

Figure 1:
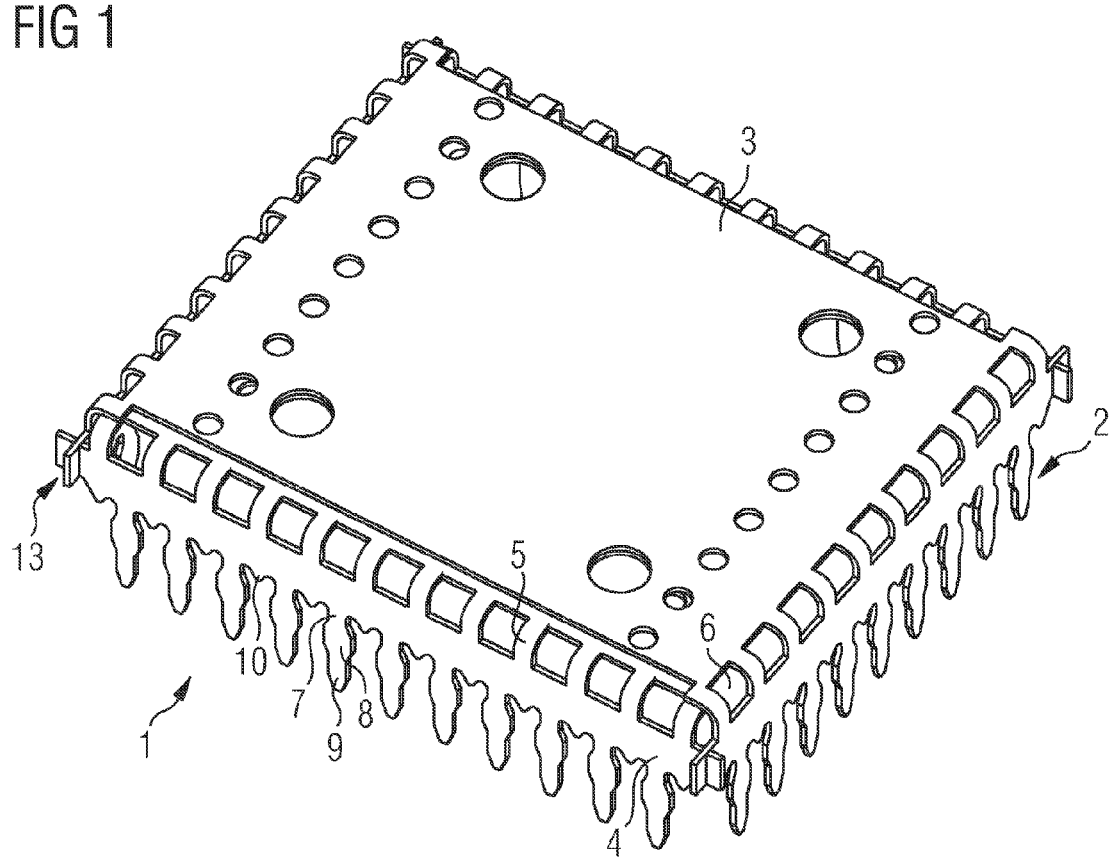
FIG. 1 A perspective view of an exemplary embodiment of a screened housing with press-fit pins.

The screened housing according to various embodiments may comprise press-fit pins and may be composed of two housing sections each comprising a housing base each with two housing edges with press-fit pins. The identically formed housing sections are blank stamping strips with press-fit pins arranged opposite each other, i.e. at parallel sides, that can be cost-effectively produced as a continuous strip in a follow-on compound tool similar to a pin press die. In this case, the number of press-fit pins per side has no substantial influence on the cost of the tool or part because only the cycle time is the determining factor. Therefore a close grid of press-fit pins is possible. Additional spring elements to achieve the required gap dimension can be omitted, and therefore also the bending processes required for these are also unnecessary. Because no spring elements are provided, the functional capability of the screened housing is more assured and moreover the press-fit connection is a gas-tight, secure electrical connection. Furthermore, the use of press-fit pins enables a simple process monitoring, by means of a simple pin-presence check, of the mounting of the screened housing on an electrical supporting component such as a circuit board. A visual inspection of the spring elements for bending can also be omitted. The screened housing according to various embodiments also offers the advantage that it has no unit size. Because the final housing shape is formed only by the parting cut and bending process, various housing variants can be produced. The follow-on compound tool for the blank stamping strips can be flexibly designed so that different widths of the blank stamping strip can be quickly realized by increasing the distance between the stamping and embossing matrices. Further advantages result for the painting processes or for carrying out functional tests of the components using standard optical and electrical equipment, because the subsequent mounting of the screened housing can take place without the application of heat.

Preferably, the housing sections are attached to each other rotated 90° relative to each other, so that the arrangement of the press-fit pins on parallel sides of the housing sections means that press-fit pins are arranged on all four circumferential sides of the screened housing.

It is preferred that the housing sections be attached to each other on the housing base so that various connecting techniques, such as stamping, clinching, welding or tox clinching can be used.

It is advantageous if the housing base can be stamped out in a variable width, so that different housing sizes can be produced.

It is advantageous if the housing edges of the housing sections that run parallel to each other have anchorage means at the ends of the sides. This anchorage means offers a secure attachment of the housing sections rotated 90° relative to each other, and reduces the gap width in the corners.

It is preferred if the screened housing has pockets for the introduction of force and for accepting the pressing tool. Because these pockets are located at the desired fold point, they also simplify the bending of the housing edges.

The method according to various embodiments for the production of a screened housing with press-fit pins may include the steps: stamping and embossing a continuous sheet-metal strip with press-fit pins arranged on two parallel sides; stamping out two housing sections from the sheet-metal strip; bending the housing edges that hold the press-fit pins by 90° and attaching the housing sections to each other. According to various embodiments by means of the method using a follow-on compound tool with a subsequent attaching step, a simple and cost-effective production of screened housings with press-fit pins arranged on all four circumferential sides is enabled. The method enables screened housings of different sizes to be produced, because the width of the housing sections can be varied during the stamping.

For the first time, a screened housing with press-fit pins arranged on all four circumferential sides can be advantageously provided, that can be produced in a simple and cost-effective manner in a follow-on compound tool. Screened housings of this kind are particularly suitable for automotive applications for screening electronic components or circuits from incoming or emitting electromagnetic radiation.

FIG. 1 shows a perspective view of an exemplary embodiment of a screened housing 1 with press-fit pins 2. The screened housing 1 has a preferably rectangular housing base 3 that terminates at all four circumferential sides in housing edges that are bent by 90° relative to the housing base 3, so that the overall shape of the screened housing 1 is a trough. To facilitate the bending of the housing edges 4, the transition from the housing base 3 to the housing edges 4 is formed as a desired fold point 5. The desired fold point 5 has pockets 6, preferably arranged spaced equally apart, which facilitate the bending of the housing edges 4. The pockets 5 also serve to accept the press tool. It is therefore possible to introduce the force directly under the press-fit pins 2 in their longitudinal direction. The housing edges 4 furthermore accommodate the press-fit pins 2, preferably arranged spaced equally apart. The housing edges 4 terminate via a transition area 7 that narrows in the direction of the press-fit pins into a bulbous area 8 of the press-fit pins 2. This bulbous area 8 finally terminates in arrow-shaped points 9 of the press-fit pins.

Lips 10, which minimize the width of the gap between the screened housing and circuit boards and also provide stability, are arranged between, and preferably alternating with, the press-fit pins 2. Furthermore, slots 11 are arranged on the edge areas in each case left and right of the opposite parallel housing edges 4, with the slots 11 serving as anchoring means 13 for permanently attaching the housing edges 4 to each other and also for serving to reduce the gap width in the corners.

Figure 2C:
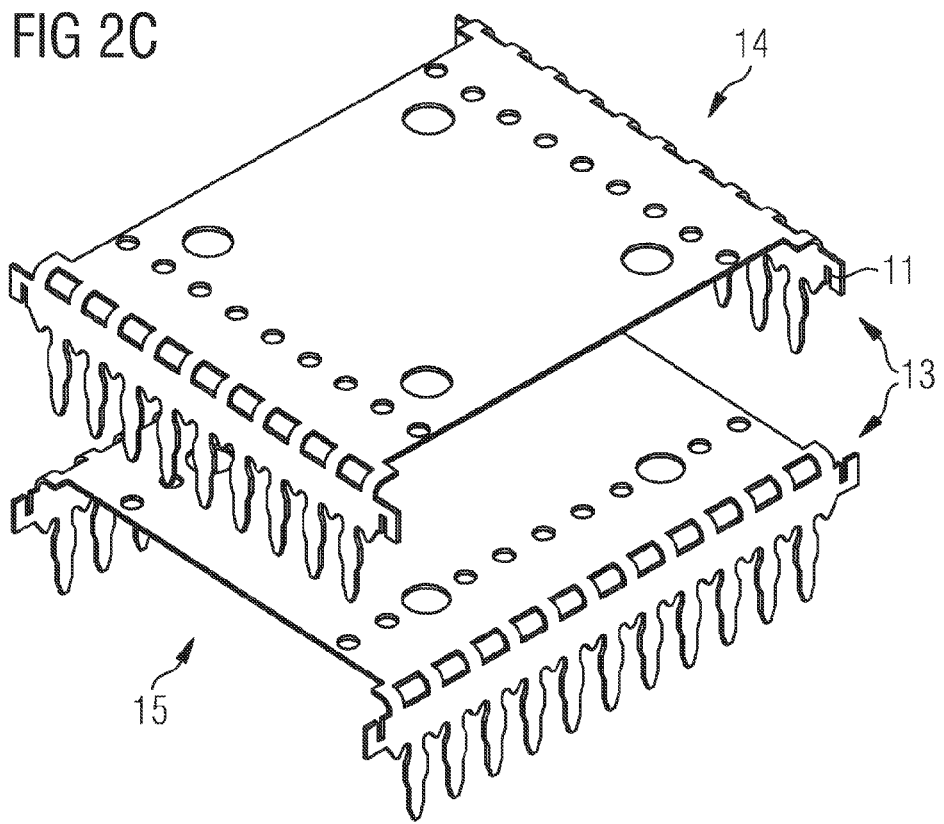

FIGS. 2a to 2d show a plan view of the individual process steps of the production method for a screened housing 1 with press-fit pins 2. FIG. 2a shows two separate blank stamping strips 16, 17 of different widths with press-fit pins 2 arranged opposite each other, with the blank stamping strip 16, 17 being produced as a continuous strip in a follow-on compound tool. The blank stamping strips 16, 17 have the housing base 3 and two housing edges 4 that are arranged on opposite parallel sides and terminate in the press-fit pins 2. Small through holes 18, which facilitate the feed in the transfer direction (TR) in the tool, are arranged in the housing base 3 running parallel to the housing edges 4. The pockets 6, the through holes 18 and the press-fit pins 2 are produced in a single stamping stroke. This means that the press-fit pins 2, the pockets 6 and the through holes 18 all lie in an identical grid and have identical dimensions in the transverse direction relative to the transfer direction.

FIG. 2b shows two finished housing sections (14, 15), stamped out from the blank stamping strips 16, 17, that receive their joint- and assembly-specific (stamping of the anchoring means) geometry from the parting cut, with the housing base 3, housing edges 4, press-fit pins 2, pockets 6 and through holes 18. In addition to the through holes 18 for the feeding operation, the housing base 3 can be provided with further piercings 19 with a mounting-specific geometry, which after the screened housing 1 has been mounted on an electrical support component, such as a circuit board, can serve as through contact holes for further electrical components.

FIG. 2c shows the housing sections 14, 15 after the housing edges 4 have been bent, rotated 90° relative to each other, so that press-fit pins 2 are arranged on all four circumferential sides of the screened housing 1. The screen housing 1 according to an embodiment is thus formed by two parts.

Figure 2D:
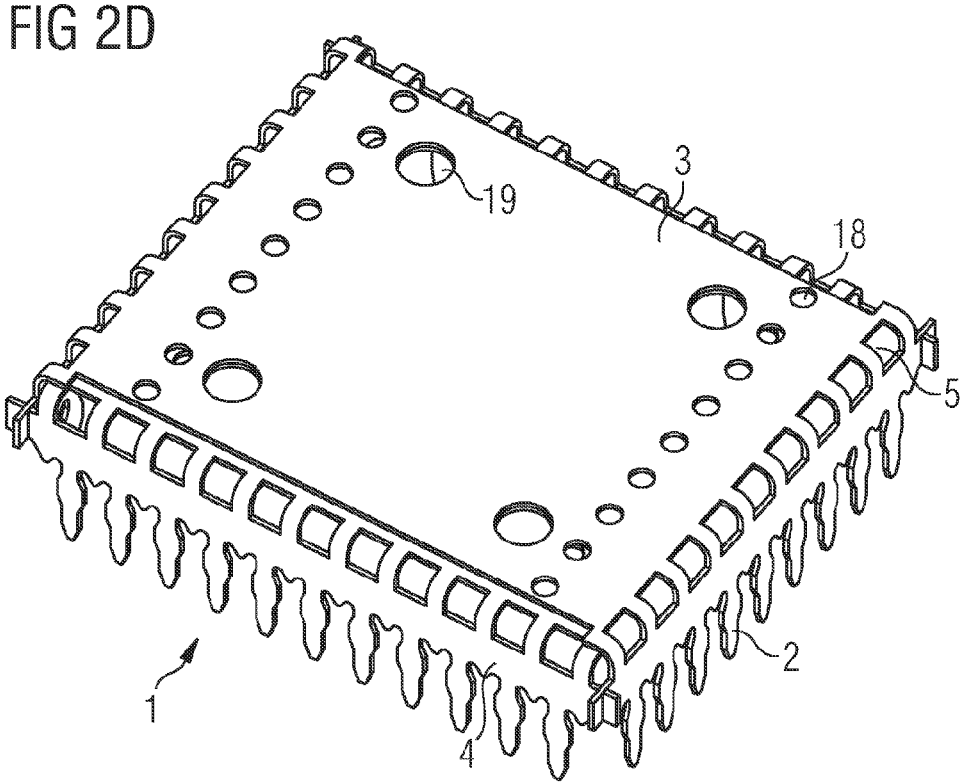

FIG. 2d shows a screened housing 1 according to an embodiment after both housing sections 14, 15 have been securely and electroconductively joined together by spot welding, stamping, tox clinching or clinching.

The method according to various embodiments for producing a screened housing (1) with press-fit pins (2) may include the steps: stamping and embossing a continuous sheet-metal strip with press-fit pins (2) arranged on two parallel sides; stamping out two housing sections (14, 15) from the sheet-metal strip; bending the edge areas containing the press-fit pins (2) through 90° and joining the housing sections (14, 15) to each other.

This invention may, thus advantageously achieve a screened housing (1) with press-fit pins arranged around all four circumferential sides, which can be produced simply and economically in a follow-on composite tool. Such screened housings (1) are particularly suitable for automotive applications for screening electrical components from incoming or emitting electromagnetic radiation.

What is claimed is:

1. A screened housing comprising press-fit pins for electrical contacting on an electrical support component, wherein the screened housing includes:
   a first housing section extending in a first axial direction from a first end to a second end and including at least one row of first housing press fit pins located at one or both of the first and second ends;
   a second housing section extending in a second axial direction from a third end to a fourth end and including a row of second housing press fit pins located at one or both of the third and fourth ends;
   wherein the first housing section is coupled to the second housing section such that the first axial direction of the first housing section is generally perpendicular to the second axial direction of the second housing section, such that each row of the first housing press fit pins extends generally perpendicular to each row of the second housing press fit pins.

2. The screened housing according to claim 1, wherein the first and second housing sections are attached to each other rotated 90° relative to each other.

3. The screened housing according to claim 1, wherein:
   the first housing section includes a first housing base defined in a central portion of the first housing section;
   the second housing section includes a second housing base defined in a central portion of the second housing section; and
   the first and second housing sections are attached to each other such that the first housing base lies directly over the second housing base.

4. The screened housing according to claim 1, wherein the first and second housing sections each have two housing edges running parallel to each other, each housing edge including at least one anchoring means for coupling the first housing section to the second housing section.

5. The screened housing according to claim 1, wherein the screened housing has pockets for the introduction of a force and to receive a press tool.

6. A method for producing a screened housing with press-fit pins for electrical contacting on an electrical supporting component comprising the steps of:
   stamping and embossing a continuous sheet-metal strip with press-fit pins arranged on two parallel sides;
   stamping out first and second housing sections from the sheet-metal strip, such that each of the first and second housing sections includes edge areas on a pair of opposite sides, each of the edge areas including a row of press-fit pins;
   for each of the first and second housing sections, bending the edge areas with the press-fit pins through 90°;
   rotating the first housing section 90° relative to the second housing section such that the rows of press-fit pins on the edge areas of the first housing section extend generally perpendicular to the rows of press-fit pins on the edge areas of the second housing section; and
   with the first housing section rotated 90° relative to the second housing section, joining the housing sections to each other.

7. The method according to claim 6, wherein:
   the first housing section includes a first housing base defined in a central portion of the first housing section;
   the second housing section includes a second housing base defined in a central portion of the second housing section; and
   the first and second housing sections are attached to each other such that the first housing base lies directly over the second housing base.

8. The method according to claim 6, wherein the first and second housing sections each have two housing edges running parallel to each other, each housing edge including at least one anchoring means for coupling the first housing section to the second housing section.

9. The method according to claim 6, further comprising forming pockets in the screened housing for the introduction of a force and for reception of a press tool.

10. A screened housing comprising:
   first and second housing sections, the first housing section having a first housing base and the second housing section having a second housing base, each of the first and second housing bases including two pinned housing edges on opposite sides of the respective housing base, each of the pinned housing edges including a row of press-fit pins,
   wherein the first and second housing sections are coupled to each other with the first housing section rotated 90° relative to the second housing section, such that the rows of press-fit pins on the two pinned housing edges of the first housing section extend generally perpendicular to the rows of press-fit pins on the two pinned housing edges of the second housing section, and
   wherein the press-fit pins are operable to form electrical contacts on an electrical support component.

11. The screened housing according to claim 10, wherein:
   the first housing base is defined in a central portion of the first housing section;
   the second housing base is defined in a central portion of the second housing section; and
   the first and second housing sections are attached to each other such that the first housing base lies directly over the second housing base.

12. The screened housing according to claim 10, wherein each of the two pinned housing edges on each of the first and second housing bases includes at least one anchoring means for coupling the first housing section to the second housing section.

13. The screened housing according to claim 10, wherein the screened housing has pockets for the introduction of a force and for reception of a press tool.

* * * * *